(12) United States Patent
Yamaguchi et al.

(10) Patent No.: US 11,276,626 B2
(45) Date of Patent: Mar. 15, 2022

(54) SEMICONDUCTOR DEVICE

(71) Applicant: Mitsubishi Electric Corporation, Tokyo (JP)

(72) Inventors: Yutaro Yamaguchi, Tokyo (JP); Masatake Hangai, Tokyo (JP); Shintaro Shinjo, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 5 days.

(21) Appl. No.: 17/025,863

(22) Filed: Sep. 18, 2020

(65) Prior Publication Data

US 2021/0005535 A1 Jan. 7, 2021

Related U.S. Application Data

(63) Continuation of application No. PCT/JP2018/021214, filed on Jun. 1, 2018.

(51) Int. Cl.
*H01L 23/485* (2006.01)
*H01L 23/482* (2006.01)
*H01L 23/528* (2006.01)
*H01L 23/66* (2006.01)

(52) U.S. Cl.
CPC ........ *H01L 23/485* (2013.01); *H01L 23/4821* (2013.01); *H01L 23/5286* (2013.01); *H01L 23/66* (2013.01); *H01L 2223/6661* (2013.01)

(58) Field of Classification Search
CPC .............. H01L 23/485; H01L 23/4821; H01L 23/5286; H01L 23/66; H01L 2223/6661
See application file for complete search history.

(56) References Cited

U.S. PATENT DOCUMENTS

| 5,233,313 A | 8/1993 | Kohno et al. |
| 9,136,205 B2 * | 9/2015 | Shimura ............. H01L 23/4824 |
| 2009/0237166 A1 | 9/2009 | Gotou et al. |
| 2012/0267795 A1 * | 10/2012 | Shimura ............. H01L 23/4821 |
| | | 257/776 |
| 2018/0006152 A1 | 1/2018 | Imai et al. |

FOREIGN PATENT DOCUMENTS

| EP | 3 255 655 A1 | 12/2017 |
| JP | 5-14069 A | 1/1993 |
| JP | 2009-232076 A | 10/2009 |
| JP | 2012-227437 A | 11/2012 |
| JP | 2016-134600 A | 7/2016 |
| WO | WO 2016/125323 A1 | 8/2016 |

OTHER PUBLICATIONS

Extended European Search Report for European Application No. 18920641.0, dated Mar. 5, 2021.
International Search Report for PCT/JP2018/021214 filed on Jun. 1, 2018, dated Aug. 7, 2018.
Office Action for Japanese Patent Application No. 2018-554420 dated Jan. 15, 2019.
Otsuka et al., "Over 57% Efficiency C-band GaN HEMT High Power Amplifier with Internal Harmonic Manipulation Circuits", 2008 IEEE MTT-S International Microwave Symposium, pp. 311-314.

* cited by examiner

*Primary Examiner* — Tucker J Wright
(74) *Attorney, Agent, or Firm* — Birch, Stewart, Kolasch & Birch, LLP

(57) ABSTRACT

In a semiconductor device including gate fingers each having a linear shape extending from a feed line, and arranged in areas between drain electrodes and source electrodes, open stubs are connected directly to the feed line.

5 Claims, 7 Drawing Sheets

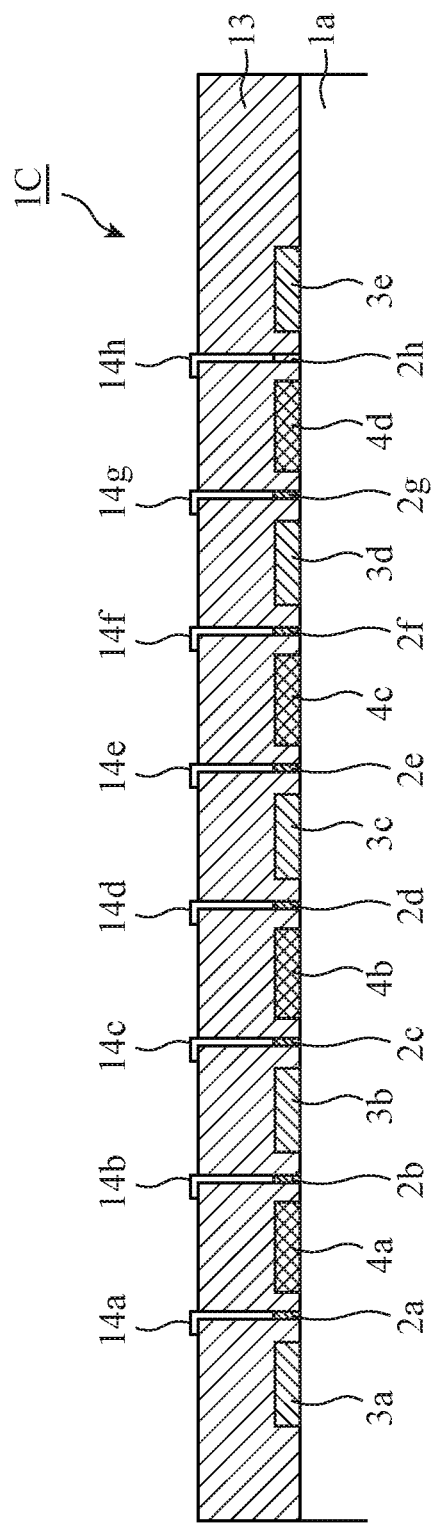

SEMICONDUCTOR DEVICE

CROSS REFERENCE TO RELATED APPLICATION

This application is a Continuation of PCT International Application No. PCT/JP2018/021214, filed on Jun. 1, 2018, which is hereby expressly incorporated by reference into the present application.

TECHNICAL FIELD

The present disclosure relates to a semiconductor device having a transistor structure.

BACKGROUND ART

Conventionally, multi-finger transistors are used for high-frequency power amplifiers. Multi-finger transistors have a structure in which multiple gate electrodes (referred to as gate fingers hereinafter) having a linear shape, multiple drain electrodes, and multiple source electrodes are arranged in a comb shape. In high-frequency power amplifiers in which multi-finger transistors are used, a higher harmonic processing circuit is used in order to increase the efficiency of transistors when operating with large signals (for example, refer to Patent Literature 1). A higher harmonic processing circuit has an open stub loaded in an input terminal or an output terminal of a transistor, and reflects a higher harmonic wave exiting from the transistor toward the transistor.

CITATION LIST

Patent Literature

Patent Literature 1: JP 2009-232076 A

SUMMARY OF INVENTION

Technical Problem

In a conventional multi-finger transistor which is typified by that of Patent Literature 1, open stubs for reflection of a higher harmonic wave are loaded in an input line, and electric power inputted to the input line is supplied to the gate fingers via a feed line. A problem with this structure is that because the distances from connection points where the open stubs are connected to the input line to the gate fingers differ for each of the multiple gate fingers, no optimal phases of the reflection of the higher harmonic wave are provided for the gate fingers at the above-mentioned connection points, and therefore the advantage of achieving a higher degree of efficiency is reduced.

The present disclosure is made to solve the above-mentioned problem, and it is therefore an object of the present disclosure to provide a semiconductor device that can achieve a higher degree of efficiency than the conventional structure.

Solution to Problem

A semiconductor device according to one aspect of the present disclosure includes: a semiconductor substrate; a plurality of drain electrodes, each of the drain electrodes being disposed along one direction on the semiconductor substrate; a plurality of source electrodes, each of the source electrodes being disposed in an area between corresponding adjacent two of the drain electrodes on the semiconductor substrate, and being disposed along the one direction; a feed line being disposed on the semiconductor substrate, and having a band shape extending in the one direction; a plurality of gate fingers, each of the gate fingers having a linear shape extending from the feed line, and being disposed in an area between two adjacent electrodes on the semiconductor substrate, one of the two adjacent electrodes being a corresponding one of the drain electrodes and the other being a corresponding one of the source electrodes; an input line disposed on the semiconductor substrate; an air bridge connecting the feed line and the input line; and a plurality of open stubs being disposed on the semiconductor substrate, having a line length that eliminates a target higher harmonic wave, and each of the open stubs passing under the air bridge and being connected directly to the feed line.

Advantageous Effects of Invention

According to the present disclosure, because each of the open stubs, having a line length which eliminates the target higher harmonic wave, is connected directly to the feed line, the distances from connection points where the open stubs are connected to the feed line to the gate fingers are substantially the same in all the gate fingers. As a result, because the reflection of the higher harmonic wave is in phase in all the gate fingers, and the higher harmonic wave can be eliminated, it is possible to achieve a higher degree of efficiency compared to the conventional structure.

Further, because the open stubs are passing under the air bridge and are connected directly to the feed line, the open stubs do not interfere with the input line. Which means that the width of the input line can be maintained to be substantially the same as that of the feed line, and the voltage of a fundamental wave inputted to each of the gate fingers can be made to be in phase. As a result, the efficiency deterioration of the transistor can be prevented.

BRIEF DESCRIPTION OF DRAWINGS

FIG. 7 is a cross-sectional view on arrow showing a cross section of the semiconductor device according to Embodiment 4, taken along the B-B line of FIG. 6.

DESCRIPTION OF EMBODIMENTS

Hereinafter, in order to explain the present disclosure in greater detail, embodiments of the present disclosure will be explained with reference to the accompanying drawings.

Embodiment 1

Figure 1:
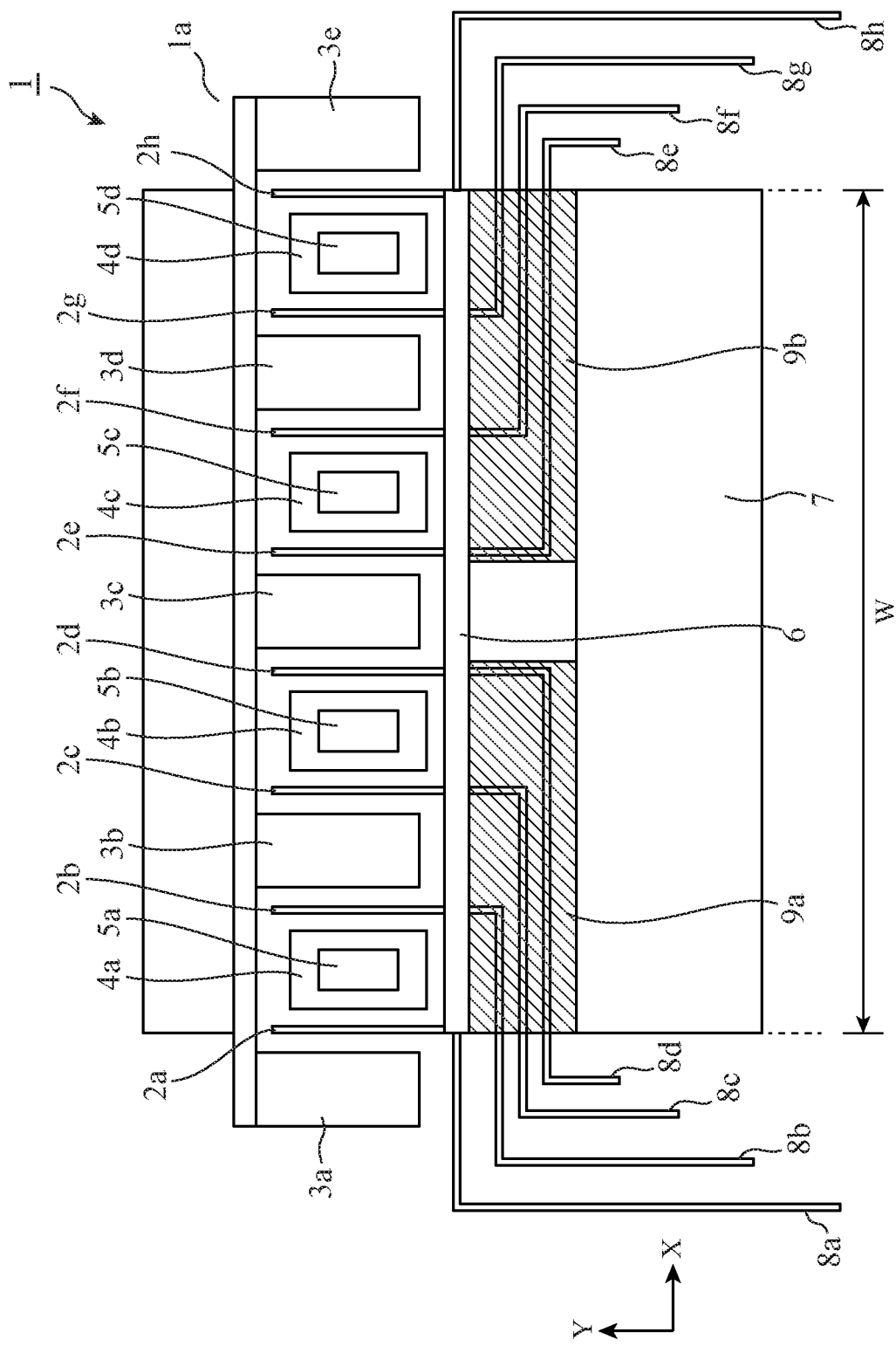
FIG. 1 is a plane view showing the layout of a semiconductor device according to Embodiment 1 of the present disclosure.

FIG. 1 is a plane view showing the layout of a semiconductor device 1 according to Embodiment 1 of the present disclosure. The semiconductor device 1 includes a semiconductor substrate 1a having a base substrate and semiconductor layers layered on one surface of the base substrate. Further, the semiconductor device 1 includes gate fingers 2a to 2h, drain electrodes 3a to 3e, source electrode 4a to 4d, vias 5a to 5d, a feed line 6, an input line 7, open stubs 8a to 8h, and air bridges 9a and 9b which are disposed on the semiconductor substrate 1a, as shown in FIG. 1. Although the structure having the eight gate fingers, the five drain electrodes, and the four source electrodes is shown in FIG. 1, the semiconductor device 1 should just have a structure in which multiple gate fingers, multiple drain electrodes, and multiple source electrodes are arranged in a comb shape.

The gate fingers 2a to 2h are gate electrodes having a linear shape extending, on the semiconductor substrate 1a, from one side of the feed line 6 (in a positive direction of a Y axis in FIG. 1), and each of the gate fingers extends along a longitudinal direction of the feed line 6 (in a direction of an X axis in FIG. 1), as shown in FIG. 1. The drain electrodes 3a to 3e and the source electrodes 4a to 4d are arranged alternately adjacent to each other along the longitudinal direction of the feed line 6. For example, the source electrode 4a is disposed in an area between the drain electrode 3a and the drain electrode 3b which are adjacent to each other, and the drain electrode 3b is disposed in an area between the source electrode 4a and the source electrode 4b which are adjacent to each other.

Further, the gate fingers 2a to 2h are arranged respectively in areas between the drain electrodes 3a to 3e and the source electrodes 4a to 4d which are arranged alternately. For example, the gate finger 2a is disposed in the area between the drain electrode 3a and the source electrode 4a, and the gate finger 2b is disposed in the area between the source electrode 4a and the drain electrode 3b.

The vias 5a to 5d are via conductors penetrating the semiconductor substrate 1a, and are electrically connected to a ground pattern existing on a rear surface of the semiconductor substrate 1a. The vias 5a to 5d are formed respectively in the source electrodes 4a to 4d, and the source electrodes 4a to 4d are grounded by the vias 5a to 5d. The feed line 6 is disposed along one direction on the semiconductor substrate 1a (a direction of the X axis in FIG. 1) and has a band shape, and supplies electric power inputted from the input line 7 to each of the gate fingers 2a to 2h.

The input line 7 extends along the same direction as the feed line 6 (a direction of the X axis in FIG. 1) on the semiconductor substrate 1a and has a band shape, and is disposed on another side of the feed line 6 (in a negative direction of the Y axis in FIG. 1). The feed line 6 and the input line 7 are electrically connected by the air bridges 9a and 9b. The electric power inputted to the input line 7 is inputted to the feed line 6 via the air bridges 9a and 9b, and is supplied from the feed line 6 to each of the gate fingers 2a to 2h.

The open stubs 8a to 8h are open-ended lines which are disposed respectively in correspondence with the gate fingers 2a to 2h and which have line lengths which cause a target higher harmonic wave to be eliminated, and are connected directly to the feed line 6 on the semiconductor substrate 1a. The line lengths of the open stubs are the same for the gate fingers 2a to 2h, and are a length providing optimal reflection phases which cause the target higher harmonic wave to be eliminated. For example, in the case of eliminating a second harmonic wave, the open stubs 8a to 8h are formed in such a way as to have a line length close to the electric length of the one-quarter wavelength of the second harmonic wave.

The open stubs 8b to 8d pass under the air bridge 9a and are connected directly to the feed line 6, and the open stubs 8e to 8g pass under the air bridge 9b and are connected directly to the feed line 6. In this structure, because the open stubs 8b to 8g do not interfere with the input line 7, the width W of the input line 7 can be maintained to be substantially the same as that of the feed line 6. By maintaining the width W of the input line 7 to be substantially the same as that of the feed line 6, the voltage of a fundamental wave inputted to each of the gate fingers 2a to 2h can be made to be in phase and the efficiency deterioration of the transistor can be prevented.

In FIG. 1, the structure in which the open stubs 8a to 8h are disposed in one-to-one correspondence with the gate fingers 2a to 2h is shown. However, the structure of the semiconductor device 1 is not limited to this structure. For example, a structure in which one open stub is disposed for two gate fingers or a structure in which one open stub is disposed for four gate fingers may be provided. Even in the case of such a structure, it is possible to achieve a degree of efficiency that is high compared with that provided by the conventional structure.

Further, the open stubs 8a to 8h are made from the same metallic material as that of the gate fingers 2a to 2h. It is generally necessary to make the gate width of the gate fingers 2a to 2h as thin as possible in microwave and millimeter wave amplifiers. Therefore, for the gate fingers 2a to 2h, plating wirings are not used, and a producing process such as a lift-off process of producing a short gate electrode pattern is used.

In order to cause the open stubs 8b to 8g to pass in such a way as to go under the air bridges 9a and 9b, it is necessary to make the line width of each of the open stubs 8a to 8h equal to or less than 10 µm. Therefore, the open stubs 8a to 8h are also produced by using, instead of plating wirings, a lift-off process using the same metallic material as that of the gate fingers 2a to 2h. As a result, the open stubs 8a to 8h can be formed to have a line width as thin as approximately 10 µm or less.

Next, an advantage provided by the structure of the semiconductor device 1 will be explained.

In the semiconductor device 1, because each of the open stubs 8a to 8h is connected directly to the feed line 6, the distances from connection points where the open stubs are connected to the feed line 6 to the gate fingers can be made to be substantially the same in the gate fingers 2a to 2h. As a result, because the reflection of the higher harmonic wave is in phase in all the gate fingers, it is possible to achieve a higher degree of efficiency than the conventional structure.

Figure 2:
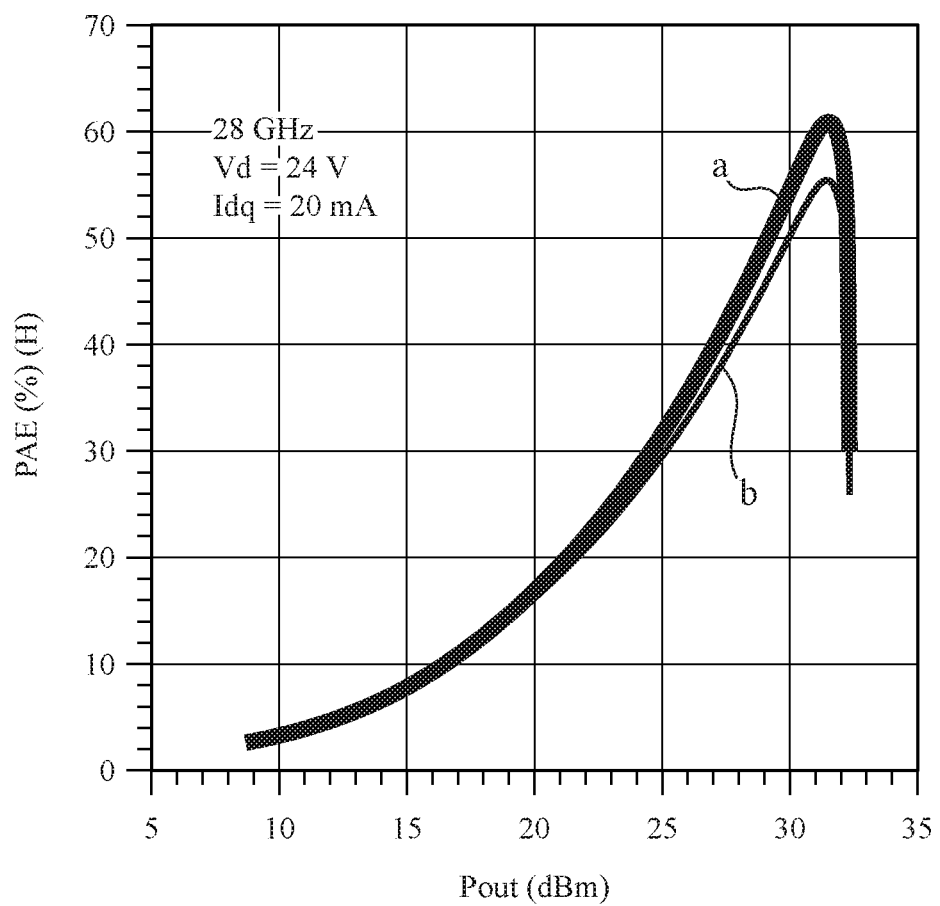
FIG. 2 is a graph showing a result of the calculation of the relation between output power and power added efficiency in the semiconductor device according to Embodiment 1 and that in a semiconductor device having a conventional structure.

FIG. 2 is a graph showing a result of the calculation of the relation between output power (Pout) and power added efficiency (PAE) in the semiconductor device 1 according to Embodiment 1 and that in a semiconductor device having a conventional structure, and the relation between Pout and PAE is calculated using a microwave circuit simulator. The horizontal axis of FIG. 2 shows the output voltage Pout, and the vertical axis shows the power added efficiency PAE.

For an active device portion (portion constituted by the gate fingers, the drain electrodes, and the source electrodes) in the transistor structure, a large signal equivalent circuit model with one finger (whose length is 40 μm) is used. For a passive device portion (portion constituted by the feed line, the input line, the open stubs, the air bridges, and the output parts of the drain electrodes) in the transistor structure, an S parameter is calculated using a 2.5-dimensional electromagnetic field calculation simulator.

The semiconductor device having the conventional structure has a structure in which the open stubs 8a to 8h and the air bridges 9a and 9b are eliminated from the structure shown in FIG. 1, and an input line 7 is connected to a feed line 6 and one open stub is connected to the input line 7. In FIG. 2, results of calculating the relation between Pout and PAE both in the semiconductor device having the above-mentioned conventional structure and in the semiconductor device 1 shown in FIG. 1 by combining the above-mentioned large signal equivalent circuit model for the active device portion, and the S parameter of the passive device portion calculated using a 2.5-dimensional electromagnetic field calculation simulator are shown.

In the calculation of the relation between Pout and PAE, the use frequency is set to 28 GHz, the drain bias voltage is set to 24V, and the drain current bias is set to 20 mA. The result of the calculation about the semiconductor device 1 is shown by a curve a, and the result of the calculation about the semiconductor device having the conventional structure is shown by a curve b. As shown in FIG. 2, the maximum PAE in the semiconductor device 1 is 61%, whereas the maximum PAE in the semiconductor device having the conventional structure is 55%. More specifically, the PAE of the semiconductor device 1 is improved to greater than that of the semiconductor device having the conventional structure.

As mentioned above, in the semiconductor device 1 according to Embodiment 1, because each of the open stubs 8a to 8h is connected directly to the feed line 6, the distances from the connection points where the open stubs 8a to 8h are connected to the feed line 6 to the gate fingers 2a to 2h are substantially the same in all the gate fingers. As a result, because the reflection of the higher harmonic wave is in phase in all the gate fingers, and the higher harmonic wave can be eliminated, it is possible to achieve a higher degree of efficiency than the conventional structure.

In the semiconductor device 1 according to Embodiment 1, the open stubs 8a to 8h are disposed in one-to-one correspondence with the gate fingers 2a to 2h. With this structure, the semiconductor device 1 can achieve a higher degree of efficiency than the conventional structure.

The semiconductor device 1 according to Embodiment 1 includes the input line 7 disposed on the semiconductor substrate 1a, and the air bridges 9a and 9b connecting the feed line 6 and the input line 7, and the open stubs 8b to 8g pass under the air bridges 9a and 9b and are connected directly to the feed line 6. In this structure, because the open stubs 8b to 8d do not interfere with the input line 7, the width W of the input line 7 can be maintained to be substantially the same as that of the feed line 6, and the voltage of the fundamental wave inputted to each of the gate fingers 2a to 2h can be made to be in phase. As a result, it is possible to prevent the efficiency deterioration of the transistor.

In the semiconductor device 1 according to Embodiment 1, the open stubs 8a to 8h are made from the same metallic material as that of the gate fingers 2a to 2h. As a result, the open stubs 8a to 8h can be produced to have a thin line width.

Embodiment 2

Figure 3:
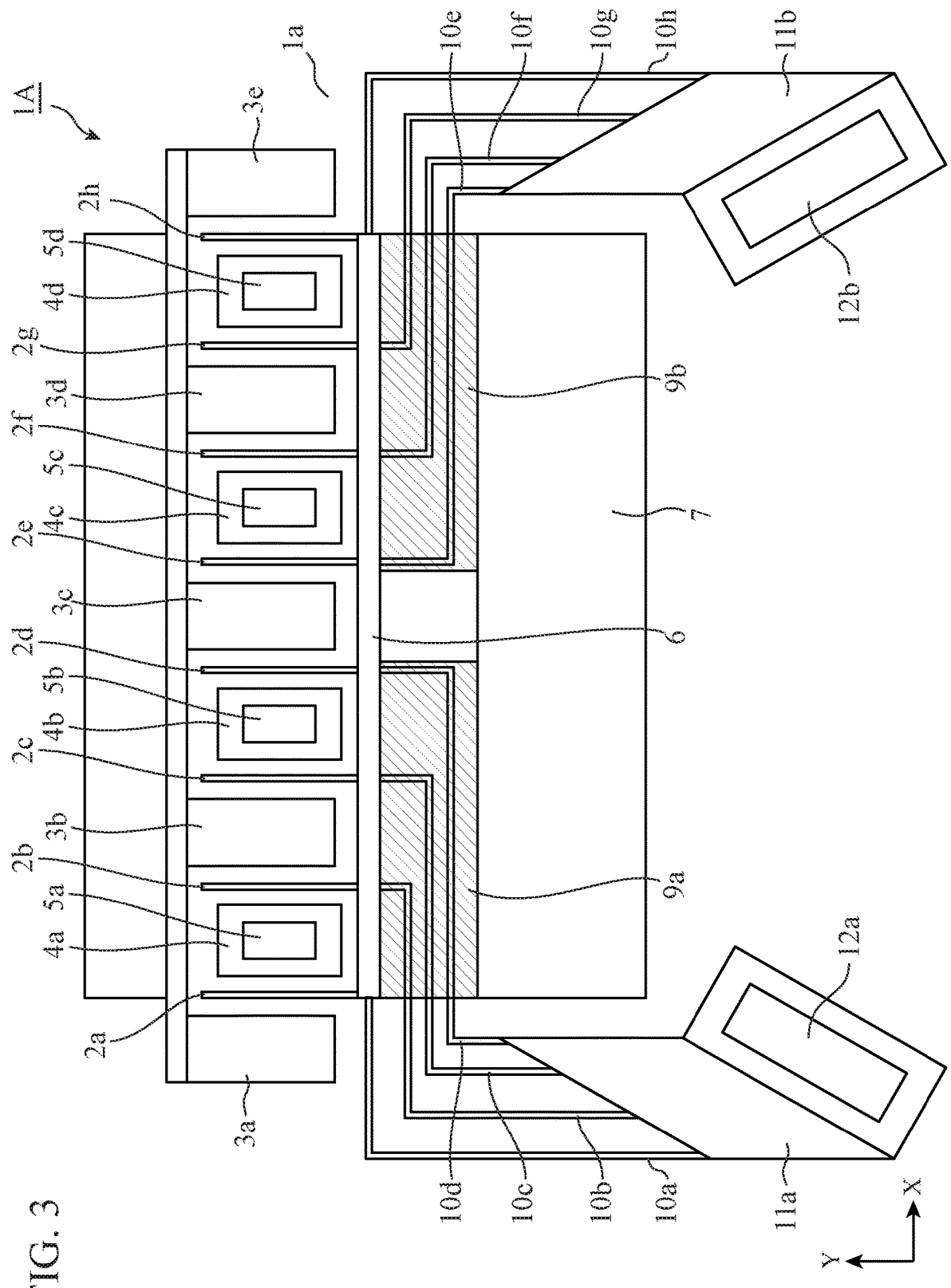
FIG. 3 is a plane view showing the layout of a semiconductor device according to Embodiment 2 of the present disclosure.

FIG. 3 is a plane view showing the layout of a semiconductor device 1A according to Embodiment 2 of the present disclosure. In FIG. 3, the same components as those shown in FIG. 1 are denoted by the same reference signs, and an explanation of the components will be omitted hereinafter. The semiconductor device 1A includes a semiconductor substrate 1a having a base substrate and semiconductor layers layered on one surface of the base substrate. Further, the semiconductor device 1A includes gate fingers 2a to 2h, drain electrodes 3a to 3e, source electrodes 4a to 4d, vias 5a to 5d, a feed line 6, an input line 7, air bridges 9a and 9b, inductance lines 10a to 10h, MIM (metal-insulator-metal) capacitances 11a and 11b, and vias 12a and 12b which are disposed on the semiconductor substrate 1a, as shown in FIG. 3.

The inductance lines 10a to 10d are connected to the MIM capacitance 11a, and the inductance lines 10e to 10h are connected to the MIM capacitance 11b. In addition, the inductance lines 10a to 10h are connected directly to the feed line 6.

The vias 12a and 12b are via conductors penetrating the semiconductor substrate 1a, and are electrically connected to a ground pattern existing on a rear surface of the semiconductor substrate. Because the via 12a is formed in the MIM capacitance 11a and the via 12b is formed in the MIM capacitance 11b, ends of the MIM capacitance 11a and 11b are grounded by the vias 12a and 12b.

Because the inductance lines 10a to 10d are connected directly to the feed line 6, the distances from connection points where LC circuits constituted by the inductance lines 10a to 10d and the MIM capacitance 11a are connected to the feed line 6 to the gate fingers are substantially the same in all the gate fingers 2a to 2h. Similarly, because the inductance lines 10e to 10h are connected directly to the feed line 6, the distances from connection points where LC circuits constituted by the inductance lines 10e to 10h and the MIM capacitance 11b are connected to the feed line 6 to the gate fingers are also substantially the same in all the gate fingers 2a to 2h. In this structure, by performing series resonance with a higher harmonic wave, the impedance of the higher harmonic wave for all the gate fingers 2a to 2h can be made to be optimal one at which the efficiency is maximized.

Further, the inductance lines 10b to 10d pass under the air bridge 9a and are connected directly to the feed line 6, and the inductance lines 10e to 10g pass under the air bridge 9b and are connected directly to the feed line 6, as shown in FIG. 3. In this structure, because the inductance lines 10b to 10g do not interfere with the input line 7, the width W of the input line 7 can be maintained to be substantially the same as that of the feed line 6. By maintaining the width W of the input line 7 to be substantially the same as that of the feed line 6, the voltage of a fundamental wave inputted to each of the gate fingers 2a to 2h can be made to be in phase and the efficiency deterioration of the transistor can be prevented.

The structure in which the inductance lines 10a to 10h are disposed in one-to-one correspondence with the gate fingers 2a to 2h is shown in FIG. 3. However, the structure of the semiconductor device 1A is not limited to this structure. For example, a structure in which one inductance line is disposed for two gate fingers or a structure in which one inductance line is disposed for four gate fingers may be provided. Even in the case of such a structure, it is possible to achieve a degree of efficiency that is higher compared with that provided by the conventional structure.

As mentioned above, in the semiconductor device 1A according to Embodiment 2, the inductance lines 10a to 10d are connected to the MIM capacitance 11a, the inductance lines 10e to 10h are connected to the MIM capacitance 11b, and the inductance lines 10a to 10h are connected directly to the feed line 6. In this structure, the distances from the connection points where the LC circuits constituted by the inductance lines 10a to 10h and the MIM capacitances 11a and 11b are connected to the feed line 6 to the gate fingers 2a to 2h are substantially the same in all the gate fingers. As a result, because the reflection of the higher harmonic wave is in phase in all the gate fingers, it is possible to achieve a higher degree of efficiency than the conventional structure.

Embodiment 3

Figure 4:
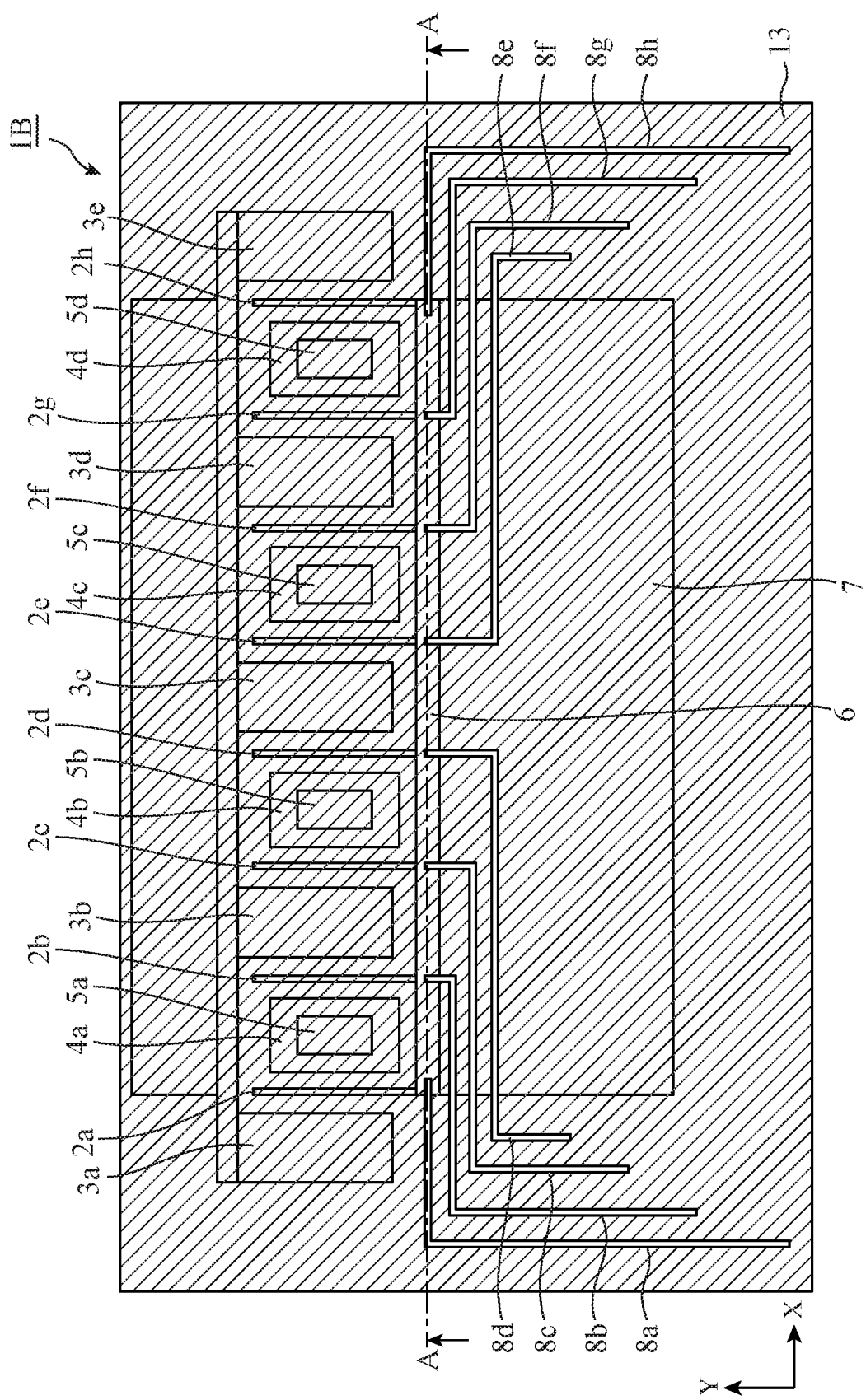
FIG. 4 is a plane view showing the layout of a semiconductor device according to Embodiment 3 of the present disclosure.
Figure 5:
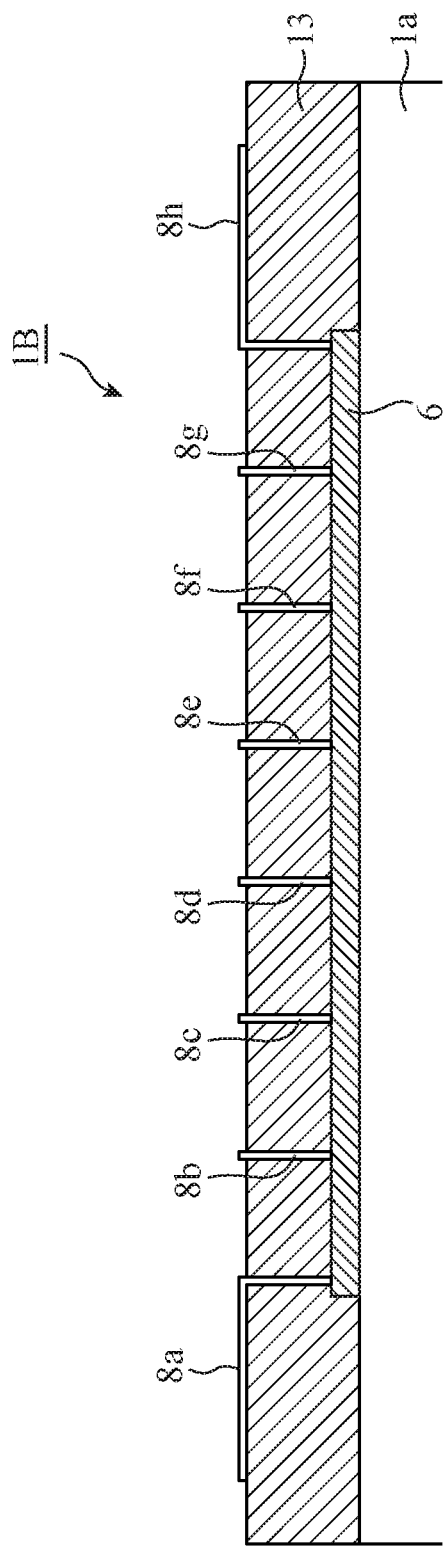
FIG. 5 is a cross-sectional view on arrow showing a cross section of the semiconductor device according to Embodiment 3, taken along the A-A line of FIG. 4.

FIG. 4 is a plane view showing the layout of a semiconductor device 1B according to Embodiment 3 of the present disclosure. FIG. 5 is a cross-sectional view on arrow showing a cross section of the semiconductor device 1B, taken along the A-A line of FIG. 4. In FIGS. 4 and 5, the same components as those shown in FIG. 1 are denoted by the same reference signs, and an explanation of the components will be omitted hereinafter. The semiconductor device 1B includes a semiconductor substrate 1a having a base substrate and semiconductor layers layered on one surface of the base substrate. Further, the semiconductor device 1B includes gate fingers 2a to 2h, drain electrodes 3a to 3e, source electrode 4a to 4d, vias 5a to 5d, a feed line 6, an input line 7, open stubs 8a to 8h, and an insulation film 13 for multilayer interconnection which are disposed on the semiconductor substrate 1a, as shown in FIG. 4.

The insulation film 13 for multilayer interconnection is formed on an upper layer of the semiconductor substrate 1a in which the gate fingers 2a to 2h, the drain electrodes 3a to 3e, the source electrodes 4a to 4d, the feed line 6, and the input line 7 are disposed, as shown in FIG. 5. The open stubs 8a to 8h are disposed on an upper side of the insulation film 13 for multilayer interconnection, and penetrate the insulation film 13 for multilayer interconnection and are connected directly to the feed line 6. Further, because the feed line 6 and the open stubs 8a to 8h are directly connected via the insulation film 13 for multilayer interconnection, the feed line 6 and the input line 7 can also be directly connected. As a result, the air bridges 9a and 9b can be eliminated.

Because the open stubs 8a to 8h are connected directly to the feed line 6, the distances from connection points where the open stubs 8a to 8h are connected to the feed line 6 to the gate fingers are substantially the same in all the gate fingers 2a to 2h. As a result, the impedance of a higher harmonic wave for all the gate fingers 2a to 2h can be made to be optimal one at which the efficiency is maximized.

As mentioned above, the semiconductor device 1B according to Embodiment 3 includes the insulation film 13 for multilayer interconnection. The insulation film 13 for multilayer interconnection is formed on an upper side of the gate fingers 2a to 2h, the drain electrodes 3a to 3e, the source electrodes 4a to 4d, and the feed line 6, and the open stubs 8a to 8h are disposed on an upper side of the insulation film 13 for multilayer interconnection. Also in this structure, because each of the open stubs 8a to 8h is connected directly to the feed line 6, the distance from the connection points where the open stubs 8a to 8h are connected to the feed line 6 to the gate fingers 2a to 2h are substantially the same in all the gate fingers. As a result, because the reflection of the higher harmonic wave is in phase in all the gate fingers, it is possible to achieve a higher degree of efficiency than the conventional structure. Further, in the semiconductor device 1B, because the feed line 6 and the input line 7 can be directly connected, the air bridges 9a and 9b can be eliminated.

Embodiment 4

Figure 6:
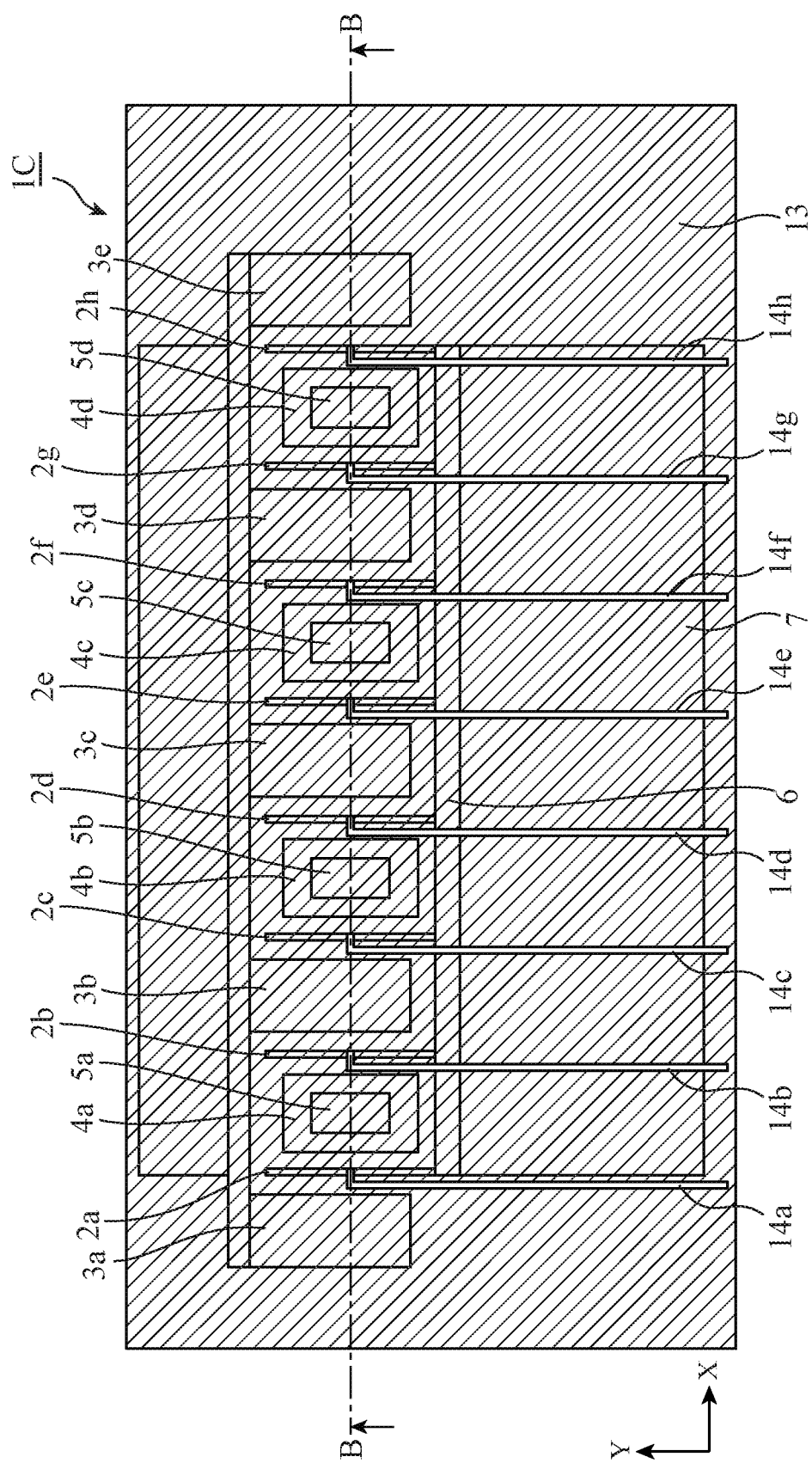
FIG. 6 is a plane view showing the layout of a semiconductor device according to Embodiment 4 of the present disclosure.

FIG. 6 is a plane view showing the layout of a semiconductor device 1C according to Embodiment 4 of the present disclosure. FIG. 7 is a cross-sectional view on arrow showing a cross section of the semiconductor device 1C, taken along the B-B line of FIG. 5. In FIGS. 6 and 7, the same components as those shown in FIG. 1 are denoted by the same reference signs, and an explanation of the components will be omitted hereinafter. The semiconductor device 1C includes a semiconductor substrate 1a having a base substrate and semiconductor layers layered on one surface of the base substrate. Further, the semiconductor device 1C includes gate fingers 2a to 2h, drain electrodes 3a to 3e, source electrode 4a to 4d, vias 5a to 5d, an input line 7, open stubs 14a to 14h, and an insulation film 13 for multilayer interconnection which are disposed on the semiconductor substrate 1a, as shown in FIG. 6.

The insulation film 13 for multilayer interconnection is formed on an upper layer of the semiconductor substrate 1a in which the gate fingers 2a to 2h, the drain electrodes 3a to 3e, the source electrodes 4a to 4d, a feed line 6, and the input line 7 are disposed, as shown in FIG. 7. The open stubs 14a to 14h are disposed on an upper side of the insulation film 13 for multilayer interconnection, and penetrate the insulation film 13 for multilayer interconnection and are connected directly to the corresponding gate fingers 2a to 2h. For example, the open stub 14a is connected directly to the corresponding gate finger 2a, and the open stub 14b is connected directly to the corresponding gate finger 2b.

Because each of the open stubs 14a to 14h is connected directly to the corresponding one of the gate fingers 2a to 2h, the impedance for a higher harmonic wave in all the gate fingers is equalized substantially. As a result, in the semiconductor device 1C, the impedance of the higher harmonic wave for the gate fingers can be made to be optimal one at which the efficiency of the transistor is maximized. Further, because the gate fingers 2a to 2h and the open stubs 14a to 14h are directly connected via the insulation film 13 for multilayer interconnection, the feed line 6 and the input line 7 can also be directly connected. As a result, the air bridges 9a and 9b can be eliminated.

As mentioned above, in the semiconductor device 1C according to Embodiment 4, each of the open stubs 14a to 14h is connected directly to the corresponding one of the gate fingers 2a to 2h. As a result, the impedance for the higher harmonic wave in all the gate fingers can be equalized to optimal one at which the efficiency of the transistor is maximized, and it is possible to achieve a higher degree of efficiency than the conventional structure. Further, in the semiconductor device 1C, because the feed line 6 and the input line 7 can be directly connected, the air bridges 9a and 9b can be eliminated.

It is to be understood that the present disclosure is not limited to the above-mentioned embodiments, and any combination of two or more of the above-mentioned embodiments can be made, various changes can be made in any component according to any one of the above-mentioned embodiments, or any component according to any one of the above-mentioned embodiments can be omitted within the scope of the present disclosure.

INDUSTRIAL APPLICABILITY

Because the semiconductor device according to the present disclosure can achieve a higher degree of efficiency than the conventional structure, the semiconductor device can be used for, for example, high-frequency power amplifiers.

REFERENCE SIGNS LIST 1, 1A, 1B, 1C semiconductor device, 1a semiconductor substrate, 2a, 2b, 2c, 2d, 2e, 2f, 2g, 2h gate finger, 3a, 3b, 3c, 3d, 3e drain electrode, 4a, 4b, 4c, 4d source electrode, 5a, 5b, 5c, 5d, 12a, 12b via, 6 feed line, 7 input line, 8a, 8b, 8c, 8d, 8e, 8f, 8g, 8h, 14a, 14b, 14c, 14d, 14e, 14f, 14g, 14h open stub, 9a, 9b air bridge, 10a, 10b, 10c, 10d, 10e, 10f, 10g, 10h inductance line, 11a, 11b MIM capacitance, and 13 insulation film for multilayer interconnection.

The invention claimed is:

1. A semiconductor device comprising:
a semiconductor substrate;
a plurality of drain electrodes, each of the drain electrodes being disposed along one direction on the semiconductor substrate;
a plurality of source electrodes, each of the source electrodes being disposed in an area between corresponding adjacent two of the drain electrodes on the semiconductor substrate, and being disposed along the one direction;
a feed line being disposed on the semiconductor substrate, and having a band shape extending in the one direction;
a plurality of gate fingers, each of the gate fingers having a linear shape extending from the feed line, and being disposed in an area between two adjacent electrodes on the semiconductor substrate, one of the two adjacent electrodes being a corresponding one of the drain electrodes and the other being a corresponding one of the source electrodes; and
an input line disposed on the semiconductor substrate;
an air bridge connecting the feed line and the input line;
a plurality of open stubs being disposed on the semiconductor substrate, and having a line length that eliminates a target higher harmonic wave, and each of the open stubs passing under the air bridge and being connected directly to the feed line.

2. The semiconductor device according to claim 1, wherein the open stubs are arranged so as to correspond one-to-one to the gate fingers.

3. The semiconductor device according to claim 1, wherein the open stubs are made from a metallic material identical to that of the gate fingers.

4. A semiconductor device comprising:
a semiconductor substrate;
a plurality of drain electrodes, each of the drain electrodes being disposed along one direction on the semiconductor substrate;
a plurality of source electrodes, each of the source electrodes being disposed in an area between corresponding adjacent two of the drain electrodes on the semiconductor substrate, and being disposed along the one direction;
a feed line being disposed on the semiconductor substrate, and having a band shape extending in the one direction;
a plurality of gate fingers, each of the gate fingers having a linear shape extending from the feed line, being disposed in an area between two adjacent electrodes on the semiconductor substrate, one of the two adjacent electrodes being the drain electrode and the other being the source electrode;
an input line disposed on the semiconductor substrate;
an air bridge connecting the feed line and the input line;
an MIM capacitance being disposed on the semiconductor substrate;
a via conductor being connected to the MIM capacitance; and
a plurality of inductance lines being disposed on the semiconductor substrate, each of the inductance lines being connected to the MIM capacitance on one end, passing under the air bridge, and being connected directly to the feed line on the other end.

5. The semiconductor device according to claim 4, wherein the inductance lines are arranged so as to correspond one-to-one to the gate fingers.

* * * * *